United States Patent
Sapp et al.

(10) Patent No.: US 8,193,570 B2
(45) Date of Patent: *Jun. 5, 2012

(54) SYNCHRONOUS BUCK CONVERTER USING SHIELDED GATE FIELD EFFECT TRANSISTORS

(75) Inventors: Steven Sapp, Felton, CA (US); Ashok Challa, Sandy, UT (US); Christopher B. Kocon, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/845,999

(22) Filed: Jul. 29, 2010

(65) Prior Publication Data

US 2011/0163732 A1 Jul. 7, 2011

Related U.S. Application Data

(63) Continuation of application No. 11/620,002, filed on Jan. 4, 2007, now Pat. No. 7,768,064.

(60) Provisional application No. 60/756,835, filed on Jan. 5, 2006.

(51) Int. Cl.
*H01L 27/108* (2006.01)

(52) U.S. Cl. .................. 257/301; 257/E27.091; 438/243

(58) Field of Classification Search .................. 257/301, 257/E27.091; 438/243
See application file for complete search history.

(56) References Cited

U.S. PATENT DOCUMENTS

| | | | |
|---|---|---|---|
| 4,399,449 A | 8/1983 | Herman et al. | |
| 4,455,565 A | 6/1984 | Goodman et al. | |
| 4,941,026 A | 7/1990 | Temple | |
| 5,179,032 A | 1/1993 | Quigg | |
| 5,429,964 A | 7/1995 | Yilmaz et al. | |
| 5,763,915 A | 6/1998 | Hshieh et al. | |
| 5,898,198 A | 4/1999 | Herbert et al. | |
| 5,912,490 A | 6/1999 | Hebert et al. | |
| 5,918,137 A | 6/1999 | Ng et al. | |
| 5,998,833 A | 12/1999 | Baliga | |

(Continued)

FOREIGN PATENT DOCUMENTS

EP 1170803 A2 1/2002

(Continued)

OTHER PUBLICATIONS

U.S. Appl. No. 12/492,101, filed Jun. 25, 2009, Gladish et al.

(Continued)

*Primary Examiner* — Thao Le
*Assistant Examiner* — Matthew Gordon
(74) *Attorney, Agent, or Firm* — Kilpatrick Townsend & Stockton LLP

(57) ABSTRACT

A synchronous buck converter includes a high-side switch and a low-side switch serially coupled to one another. The low-side switch includes a field effect transistor that comprises: a trench extending into a drift region of the field effect transistor; a shield electrode in a lower portion of the trench, wherein the shield electrode is insulated from the drift region by a shield dielectric; a gate electrode in the trench over the shield electrode, wherein the gate electrode is insulated from the shield electrode by an inter-electrode dielectric; source regions adjacent the trench; a source metal contacting the source regions; and a resistive element having one end contacting the shield electrode and another end contacting the source metal in the field effect transistor.

20 Claims, 7 Drawing Sheets

U.S. PATENT DOCUMENTS

| | | | |
|---|---|---|---|
| 6,150,675 | A | 11/2000 | Franke et al. |
| 6,351,018 | B1 | 2/2002 | Sapp |
| 6,600,182 | B2 | 7/2003 | Rumennik |
| 6,653,691 | B2 | 11/2003 | Baliga |
| 6,683,346 | B2 | 1/2004 | Zeng |
| 6,750,508 | B2 | 6/2004 | Omura et al. |
| 6,870,220 | B2 | 3/2005 | Kocon et al. |
| 6,891,223 | B2 | 5/2005 | Krumrey et al. |
| 7,345,342 | B2 | 3/2008 | Challa et al. |
| 7,768,064 | B2 * | 8/2010 | Sapp et al. .................... 257/330 |
| 2002/0036326 | A1 | 3/2002 | DeJong |
| 2004/0157384 | A1 | 8/2004 | Blanchard |
| 2005/0056886 | A1 | 3/2005 | Tihanyi |
| 2006/0220107 | A1 * | 10/2006 | Lui et al. ....................... 257/330 |
| 2006/0273379 | A1 | 12/2006 | Bhalla et al. |
| 2007/0138548 | A1 | 6/2007 | Kocon et al. |

FOREIGN PATENT DOCUMENTS

| | | |
|---|---|---|
| JP | 63-296282 A | 12/1988 |

OTHER PUBLICATIONS

Non-Final Office Action for U.S. Appl. No. 11/620,002, mailed on Sep. 17, 2009, 11 pages.

Notice of Allowance for U.S. Appl. No. 11/620,002, mailed on Mar. 29, 2010, 8 pages.

* cited by examiner

SYNCHRONOUS BUCK CONVERTER USING SHIELDED GATE FIELD EFFECT TRANSISTORS

CROSS-REFERENCES TO RELATED APPLICATIONS

This application is a continuation of U.S. application Ser. No. 11/620,002, filed Jan. 4, 2007, which claims the benefit of U.S. Provisional Application No. 60/756,835, filed Jan. 5, 2006. All are incorporated herein by reference in their entirety for all purposes.

BACKGROUND

The present invention relates in general to semiconductor power field effect transistors (FETs) and in particular to shielded gate trench MOSFETs with improved reverse recovery currents.

Shielded gate trench MOSFETs provide unique advantages over conventional MOSFETs, such as reduced gate-to-drain capacitance $C_{gd}$, reduced on-resistance $R_{DSon}$, and increased breakdown voltage of the transistor. In particular, the placement of many trenches in a channel decreases the on-resistance but also increases the gate-to-drain capacitance. The shielded gate structure solves this problem by shielding the electric field in the drift region from the gate, thereby substantially reducing the gate-to-drain overlap capacitance. The shielded gate structure also allows for reducing the carrier concentration in the drift region to increase the breakdown voltage without impacting the on-resistance of the device. As a result, shielded gate trench MOSFETs have demonstrated superior performance characteristics and high switching speed.

The superior performance characteristics of the shielded gate trench MOSFET make the technology an excellent choice for power switching applications such as the switching converter commonly known as the synchronous buck converter (DC-DC converter). The shielded gate trench MOSFET is particularly suitable for the high-side switch in the synchronous buck converter. However, for the low-side switch which operates as a synchronous rectifier, excessive charge during the reverse recovery of the body diode results in increased power dissipation and reduced converter efficiency. There is therefore a need for reducing the reverse recovery loss in shielded gate trench MOSFETs.

BRIEF SUMMARY

Various embodiments of the present invention provide shielded gate trench transistors with reduced reverse recovery loss. In accordance with one embodiment of the invention, a field effect transistor includes a trench extending into a drift region of the field effect transistor. A shield electrode in a lower portion of the trench is insulated from the drift region by a shield dielectric. A gate electrode is formed in the trench atop the shield electrode and insulated therefrom by an inter-electrode dielectric. A resistive element is coupled between the shield electrode and a source region of the transistor. The inclusion of the resistive element reduces the reverse recovery charge by enabling the voltage on the shield electrode to increase in response to a relatively small charge that develops on the shield capacitor due to the increasing potential in the drain.

In accordance with another embodiment of the invention, a semiconductor device includes a drift region of a first conductivity type. A well region having a second conductivity type opposite the first conductivity type extends above the drift region. A trench extends through the well region and into the drift region, the trench having its sidewalls and bottom lined with dielectric material. The trench is substantially filled with a shield conductive layer and a gate conductive layer above the shield conductive layer. The shield conductive layer is separated from the gate conductive layer by an inter-electrode dielectric material. Source regions having the first conductivity type are formed in the well region adjacent to the trench. A resistive element is electrically coupled to the shield conductive layer and to the source regions.

In accordance with another embodiment of the invention, a field effect transistor includes a trench extending into a drift region. A shield electrode in a lower portion of the trench is insulated from the drift region by a shield dielectric. A gate electrode in the trench over the shield electrode is insulated from the shield electrode by an inter-electrode dielectric. A potential is induced in the shield electrode during a switching event.

In accordance with another embodiment of the invention, a field effect transistor includes a trench extending into a drift region. A shield electrode in a lower portion of the trench is insulated from the drift region by a shield dielectric. A gate electrode in the trench over the shield electrode is insulated from the shield electrode by an inter-electrode dielectric. A voltage that changes with time is induced in the shield electrode during a switching event.

In accordance with another embodiment of the invention, a field effect transistor includes a drift region and a trench extending into the drift region. A transient potential is produced in the drift region. A shield electrode in a lower portion of the trench is insulated from the drift region by a shield dielectric. A gate electrode in the trench over the shield electrode is insulated from the shield electrode by an inter-electrode dielectric. A transient potential is induced in the shield electrode that follows the transient potential in the drift region.

In accordance with another embodiment of the invention, a field effect transistor includes a drift region and a trench extending into the drift region. A transient potential is produced in the drift region. A shield electrode in a lower portion of the trench is insulated from the drift region by a shield dielectric. A gate electrode in the trench over the shield electrode is insulated from the shield electrode by an inter-electrode dielectric. The potential in the drift region creates a charge in the shield electrode, and a potential is induced in the shield electrode in dynamic response to the charge.

In accordance with another embodiment of the invention, a method of forming a field effect transistor includes forming a trench in a drift region. A shield electrode is formed in a lower portion of the trench and is insulated from the drift region by a shield dielectric. A gate electrode is formed in the trench over the shield electrode and is insulated from the shield electrode by an inter-electrode dielectric. A source region is formed adjacent to the trench. A resistive element is formed coupling to the shield electrode and to the source region.

A better understanding of the nature and advantages of the present invention can be gained from the following detailed description and the accompanying drawings.

DETAILED DESCRIPTION

Diode reverse recovery refers to the process whereby the minority carrier charge stored in the drift region is removed so that the p-n junction diode can be switched from forward to reverse bias. In the context of a shielded gate trench MOSFET, the inventors have found that the displacement current in the shield electrode contributes significantly to the reverse recovery of the body diode. This displacement current is due to the capacitor formed between the drift or drain region and the shield electrode, referred to herein as $C_{Dsh}$. The magnitude of the charge associated with the shield displacement current can be comparable to that of the charge expected from the diode's recovery current alone. Thus, the use of an integrated Schottky diode as described in commonly-owned U.S. Pat. No. 6,351,018 would provide little if any improvement in the diode recovery since any reduction in the total reverse recovery charge would be offset by the shield electrode's contribution to this charge. Various embodiments of the present invention solve the problems described above by reducing the shield displacement current during the diode's reverse recovery cycle.

Figure 1:
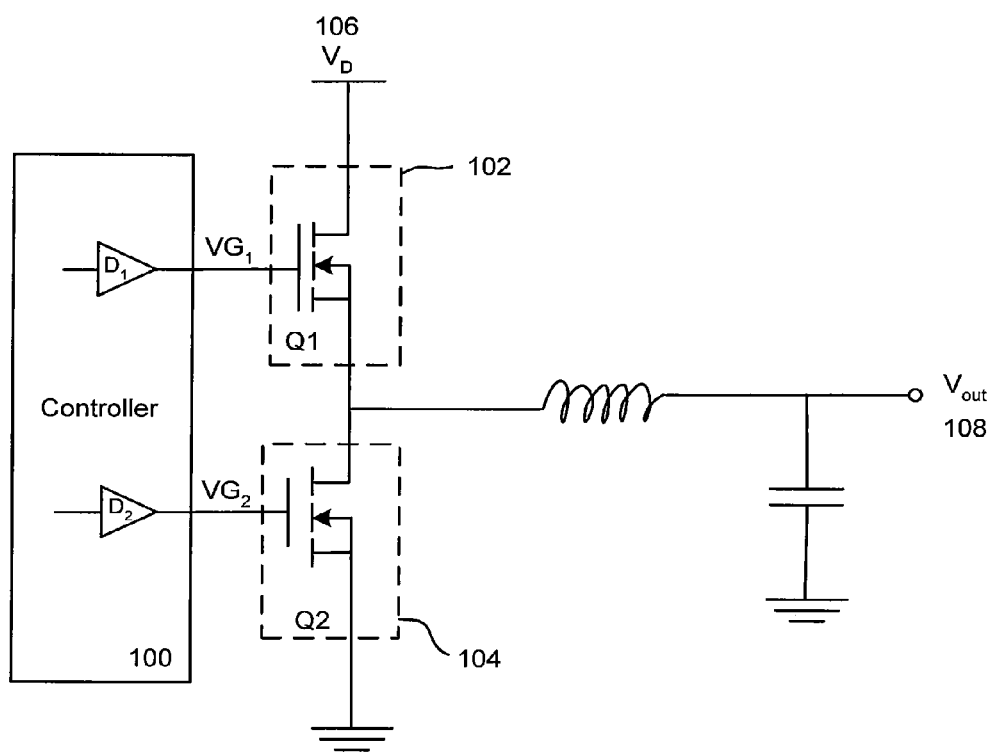
FIG. 1 shows a simplified schematic of the high side and low side switches of a synchronous buck converter.

FIG. 1 shows a simplified schematic of an exemplary synchronous buck converter. The circuit shown includes a switch 102, which is commonly referred to as the "high side switch," and a switch 104, which is commonly referred to as the "low side switch." High side switch 102 is implemented by MOSFET Q1 which is connected between $V_D$ 106 and an inductor, and low side switch 104 is implemented by MOSFET Q2. MOSFETS Q1 and Q2 are connected to $V_{out}$ 108 through an inductor. A controller block 100 drives the gates of transistors Q1 and Q2.

As described above, an increase in the reverse recovery current impairs the performance of Q2 which functions as a synchronous rectifier and reduces the efficiency of the converter circuit. For example, during a switch cycle of the converter in FIG. 1, driver D2 turns on low side switch 104 while high side switch 102 is turned off. However, a time delay occurs after D2 turns off low side switch 104, and before D1 turns on high side switch 102, to insure that there is no cross conduction. This "dead-time" during which both switches are off minimizes losses caused by cross conduction. An increase in the reverse recovery current at the low side switch increases the recovery time to return the low side switch to its non-conducting state. As a result, when the high side switch is turned on at the end of the dead-time, the excess reverse recovery charge at the low side switch feeds back to the high side switch and causes energy loss.

Figure 2:
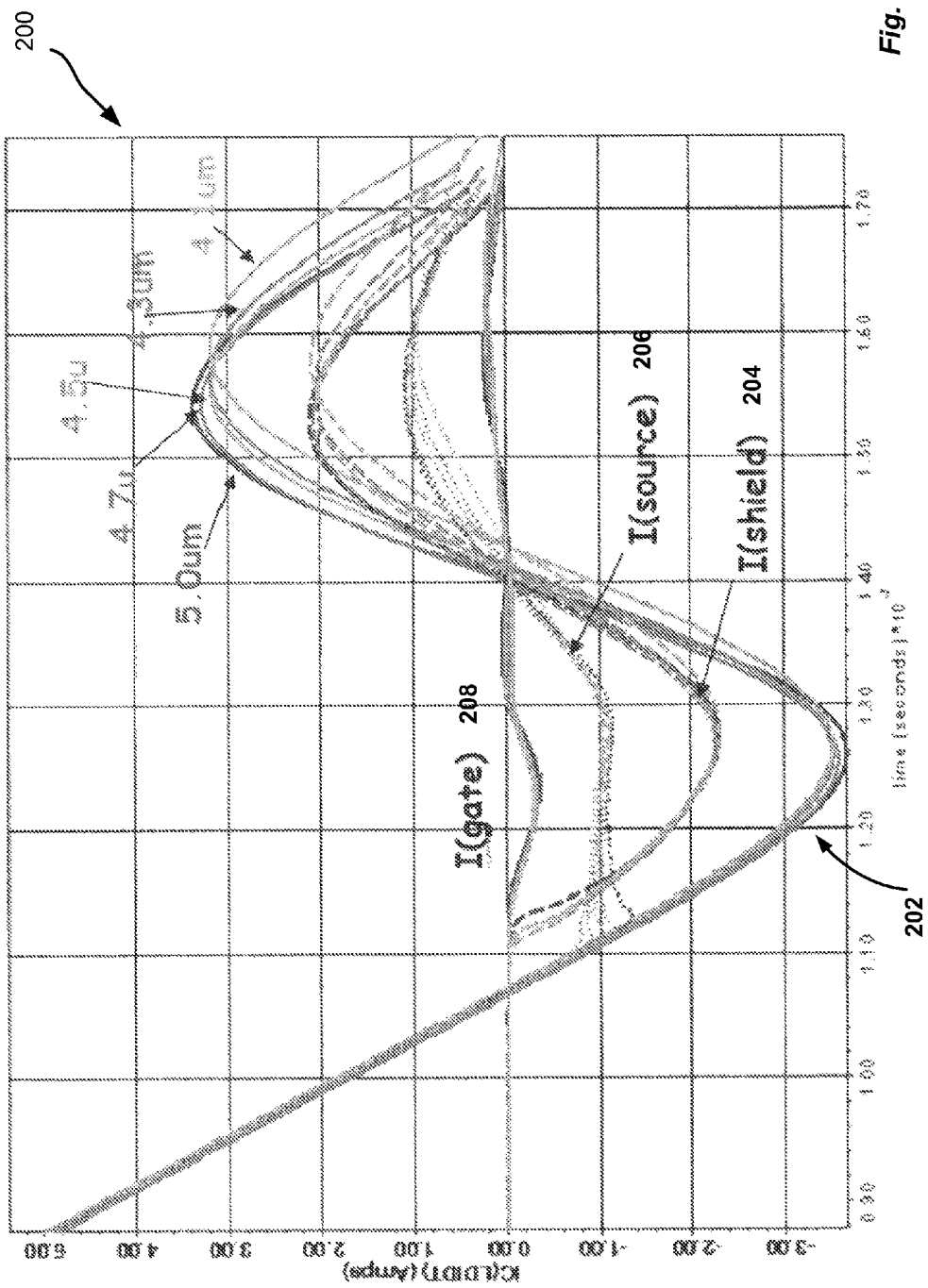
FIG. 2 shows a simulated graph of the reverse recovery current vs. time for a shielded gate trench MOSFET.

A simulation of the reverse recovery of an exemplary shielded gate trench transistor is provided in FIG. 2. The current versus time graph 200 shows that the reverse recovery current 202 starts at about 1.1 sec ($10^{-7}$). As the diode goes from forward to reverse bias, the voltage transition in the drift region produces a displacement current in the capacitor formed by the shield electrode as follows:

$$i = C\frac{dV}{dt} \tag{1}$$

The displacement current introduced by the shield electrode contributes to the total current during the diode recovery, since the shield is connected to the source. The contribution of the shield electrode to the total current is shown by 204. The contribution to the total current by the source is given by 206, and the contribution to the total current by the gate is given by 208. Comparing the shield displacement current 204 to the total current 202 shows that, in this example, the shield charge contributes almost 50% of the total diode reverse recovery charge. The source current 206 is the component of the total current due to minority carrier recombination and drift, the normal p-n diode recovery current elements.

Figure 3:
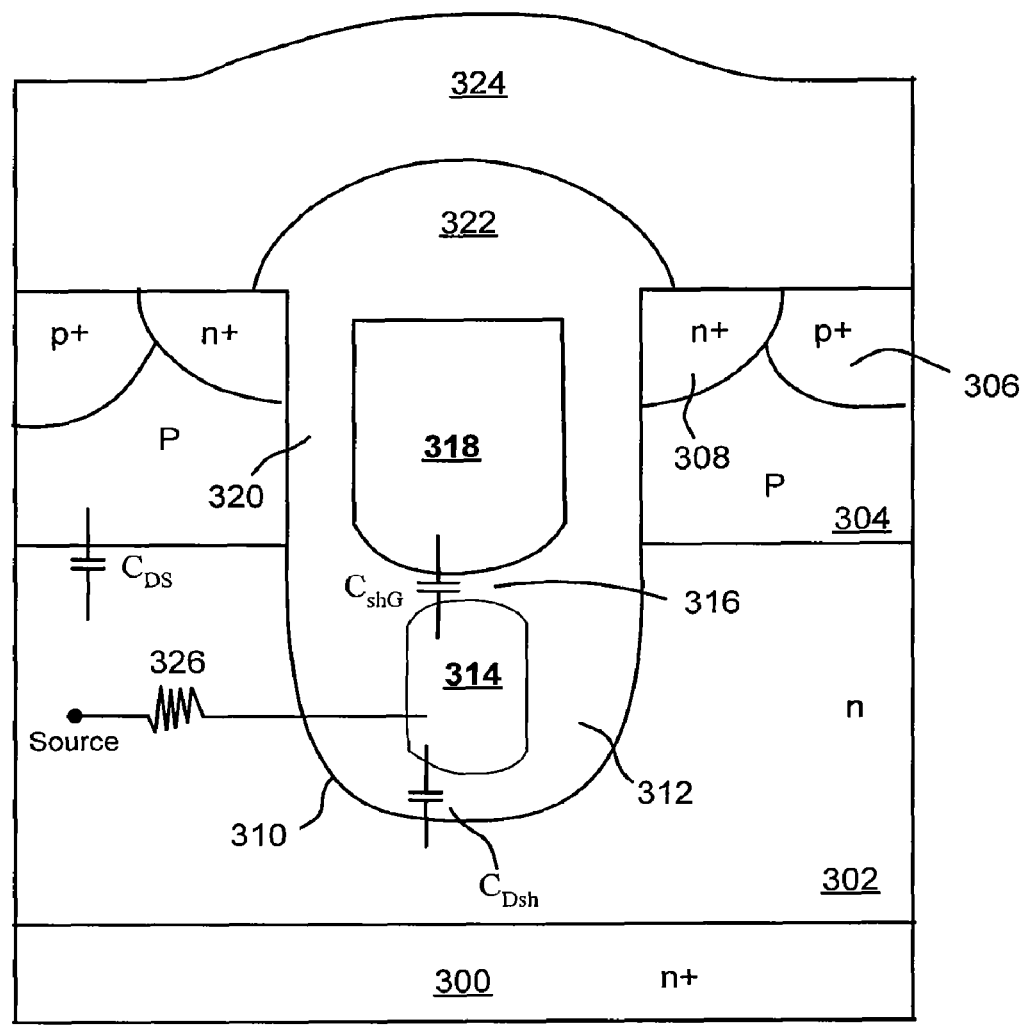
FIG. 3 shows a cross sectional view of a shielded gate trench MOSFET with capacitor elements representing sources of parasitic capacitance, and a resistor symbol representing a resistive connection between the shield electrode and the source in accordance with an embodiment of the invention.

The sources of the relevant parasitic capacitance are illustrated in FIG. 3, which shows a simplified cross sectional view of an exemplary shielded gate trench MOSFET. As with all the other figures described herein, the relative dimensions and sizes of the elements shown do not reflect actual dimensions and are for illustrative purposes only. FIG. 3 shows a trench 310 extending from a top surface through a p-type well or body region 304, and ending in an n-type drift or epitaxial region 302. P+ regions 306 are located adjacent n+ source regions 308. A dielectric layer 322 extends over gate electrode 318, and source metal 324 contact n+ source regions 306 and p+ regions 306. A drain terminal is formed at the backside of the substrate connecting to a heavily doped n+ substrate region 300. When the transistor is turned on, a conducting channel is formed vertically between n+ source regions 308 and drift region 302 along the walls of gate trenches 310.

Trench 310 includes a gate electrode 318, and a shield electrode 314 directly under gate electrode 318. Shield electrode 314 is insulated from adjacent regions by a shield dielectric 312, and gate electrode 318 is insulated from adjacent regions by gate dielectric 320. The gate and shield electrodes are insulated from each other by a dielectric layer 316 commonly referred to as an inter-poly dielectric or IPD. The IPD layer must have sufficient thickness and quality to support the voltage between the gate and shield electrodes. In other embodiments, shield electrode 314 may comprise a number of electrodes, may have various sizes and dimensions, or may be independently biased, depending on the switching application and particular voltage requirements of the applications.

The total parasitic capacitance in the MOSFET of FIG. 3 is represented by three main components: the drift region capacitance between the drain and the source, $C_{DS}$, the overlap capacitance between the drain and the shield, $C_{Dsh}$, and the overlap capacitance between the shield and the gate, $C_{shG}$. The shield electrode 314 shields the gate electrode 318 from having any substantial overlap with drift region 302, thereby significantly reducing the gate-to-drain overlap capacitance.

In one embodiment of the invention, a resistive element 326 is added to the connection between the shield electrode 314 and the source 308. FIG. 3 shows a highly simplified and symbolic connection to the source electrode for illustrative purposes. Adding a resistive element 326 to the connection between the shield and the source causes the shield displacement current to be impeded when the drain voltage transitions to its static condition during a switching event. The resistive element 326 enables the voltage on the shield electrode 314 to increase in response to a relatively small charge that develops on the capacitor across shield dielectric 312 due to the increasing potential at the drain 300. The consequence of the induced potential on the shield electrode 314 is that the voltage at the shield electrode 314 changes with the voltage changes occurring in the drift region 302, which reduces the differential voltage between the shield electrode 314 and the drain 300. Thus, the dV/dt at the drain-shield capacitor decreases, and the overall displacement current at the shield electrode defined by Equation 1 above is accordingly reduced.

The shield electrode may be manipulated in various ways to optimize the performance of a device in a given application. For example, the shield electrode can be passively controlled by a fixed potential, either ground or otherwise, or the shield electrode can be actively managed such that the potential at the shield is always greater than the potential at the drain. However, in each embodiment of the invention, the shield electrode dynamically follows the potential at the drift region when a transient appears on the drain. In contrast, biasing the shield electrode either passively or actively with a fixed potential fails to consider the transient condition when switching between operating modes. Thus, the reduction in dV/dt by the close tracking of transient potentials according to embodiments of the invention more significantly reduces the shield charge contribution to improving the diode's reverse recovery charge.

Figure 4:
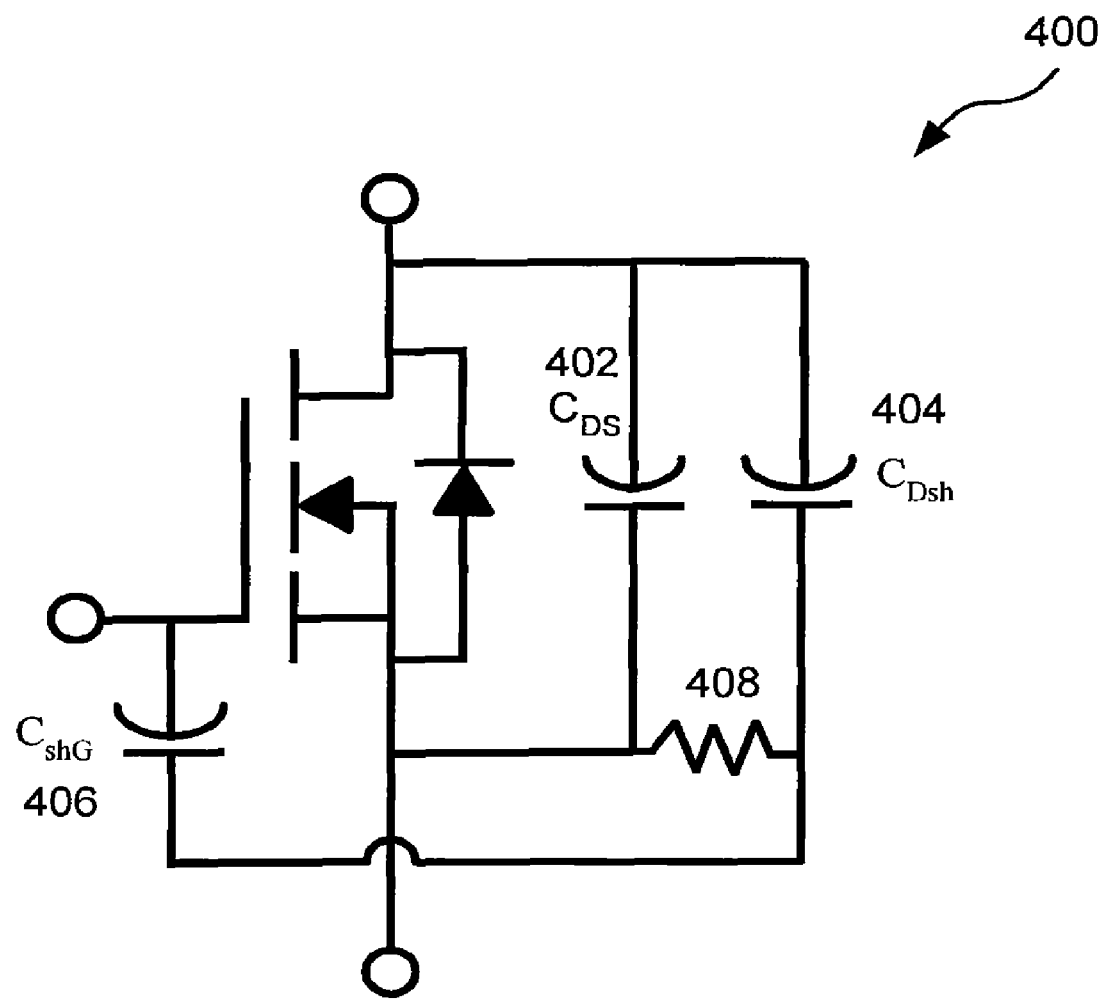
FIG. 4 shows an equivalent circuit for an embodiment of the invention.

FIG. 4 shows an equivalent circuit 400 for the embodiment of FIG. 3. The capacitance between the drain and the source $C_{DS}$ is represented by 402, the capacitance between the drain and the shield $C_{Dsh}$ is represented by 404, and the capacitance between the shield and gate $C_{shG}$ is represented by 406. The resistive element at 408 according to an embodiment of the invention is connected to the shield capacitor $C_{Dsh}$. The capacitors $C_{DS}$ and $C_{Dsh}$ are connected in parallel to form the following overall capacitive ratio:

$$Vgsb \propto Vds \frac{Cshg}{\left[\frac{Cshg(Cds + Cdsh)}{Cshg + Cds + Cdsh}\right]} \quad (2)$$

The potential $V_{gsb}$ represents the potential increase that occurs in the gate electrode in response to a transient potential in the drain, and is proportional to the overall capacitive ratio. This potential value impacts various design considerations according to other embodiments of the invention further discussed below.

Figure 5A:
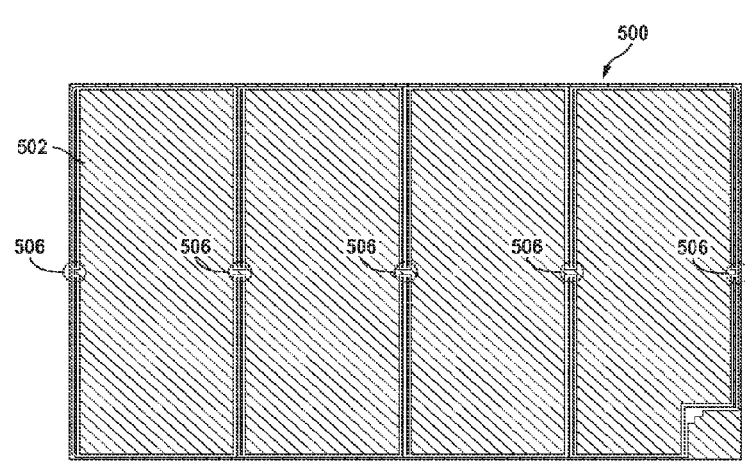
FIG. 5A shows a top view of an embodiment of the invention.

FIG. 5A shows a top view of an embodiment of the invention showing an exemplary implementation for the inclusion of the resistive element. Semiconductor die 500 includes source metal 502 and gate metal 504. The gate buss is illustrated in the amplified view of FIG. 5B. The independent shield metal 508 runs parallel to the gate buss 504. An independent shield metal line is used to maintain the uniformity of the shield potential and connect it to the source reference potential through a poly-silicon resistor. Many other layout solutions incorporating the shield resistor are possible. In one embodiment, factors taken into account are minimizing the chip area usage, providing resistor value flexibility, and maintaining uniform shield potential throughout the device.

Figure 5B:
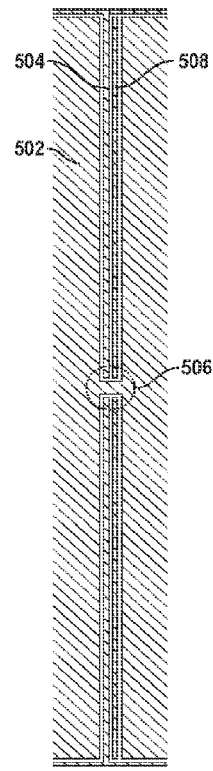
FIG. 5B shows an enlarged top view of an embodiment of the invention.
Figure 5C:
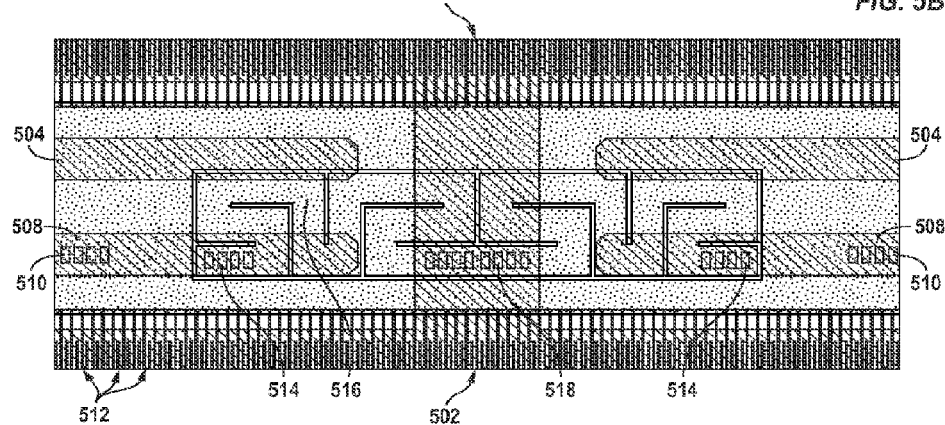
FIG. 5C shows a top view of an embodiment of the invention.

FIG. 5C shows an enlarged top view correlating to section 506 marked by the dashed circles in FIGS. 5A, 5B. The strip of source metal that runs horizontally across the middle of section 506 in FIGS. 5A, 5B is displayed vertically across the middle in FIG. 5C, with the layer of source metal 502 at the top and bottom of the top view. The trench layout is shown at 512, where individual trenches are defined by the vertically extending lines. In FIG. 5A, these trenches (not shown) run horizontally below the top layer of source metal 502. FIG. 5C shows the resistive element according to one embodiment of the invention in a layer 516 between end contacts 514 and 518. Contacts 514 connect the resistor 516 to the independent shield metal 508, the shield electrode contact 510 connects the independent shield metal 508 to the shield electrode, and contact 518 connects the resistor 516 to the source metal 502.

Figure 5D:
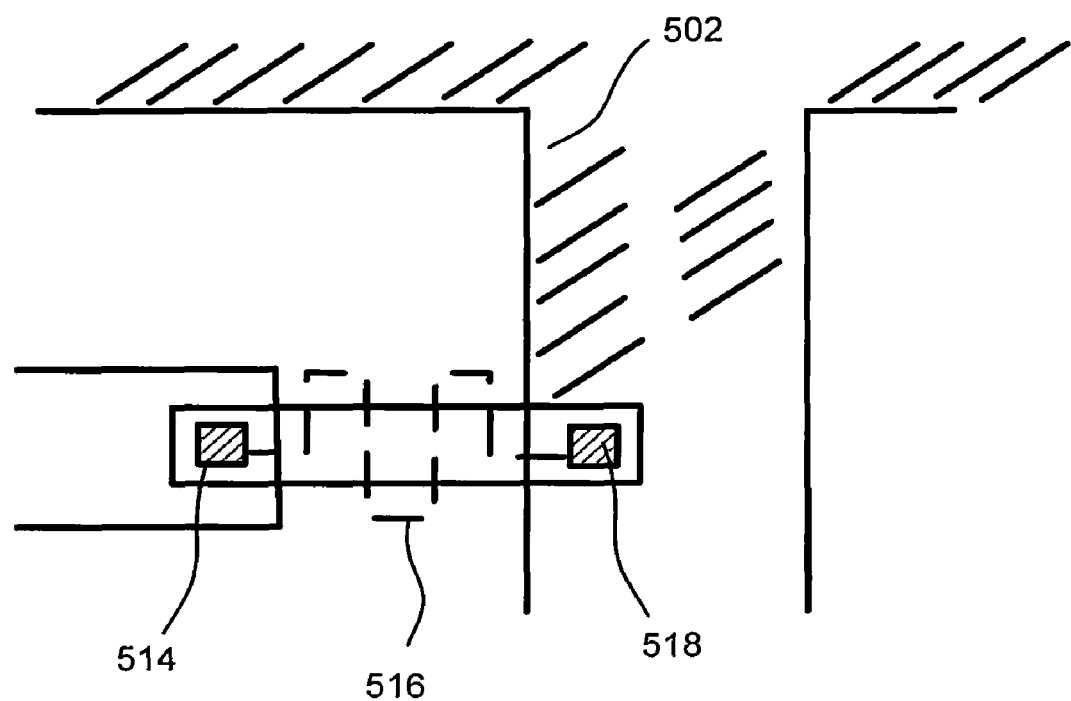
FIG. 5D shows an enlarged simplified top view of an embodiment of the invention.

FIG. 5D shows a simplified, expanded view of the top view of 5C. In a conventional shielded gate MOSFET, there is typically no resistor between contacts 514 and 518. Instead, the shield electrode is directly connected to the source in a conventional shield gate structure. According to one embodiment of the invention, the resistor 516 has a serpentine form as shown in FIG. 5C and by the dashed lines in FIG. 5D to increase the length of the resistor and thus increase the magnitude of the resistance. The resistive element may be implemented by polysilicon, diffusion or other suitable material. Other embodiments incorporating the resistive element are possible. For example, the resistive element may be a single resistor, or it may be multiple resistors distributed throughout the die. In an embodiment with a single resistor, the resistive element may be formed at a location where all of the shield electrodes are connected, or it may be formed on either end of a shield electrode. In an embodiment with multiple resistors, the resistive elements may be connected in parallel. Various layouts and implementations are possible, so long as the resistive element is greater than the overall distributive resistance of the shield electrodes.

Figure 6:
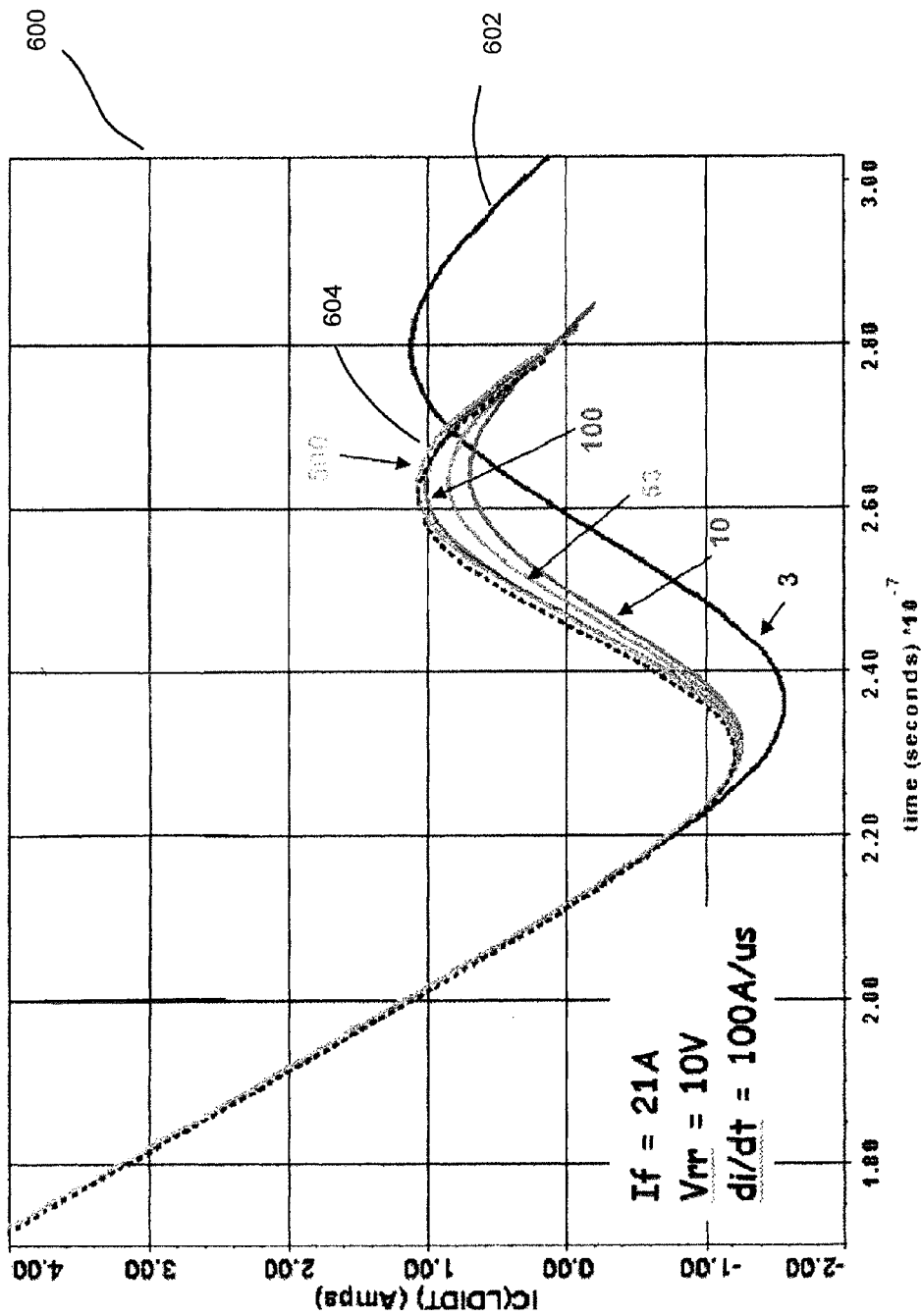
FIG. 6 shows a simulated graph of the reverse recovery current vs. time for a shielded gate trench MOSFET modified in accordance with an embodiment of the invention.

A simulation of the diode reverse recovery with a resistive element according to an embodiment of the invention is shown in FIG. 6. The current versus time graph 600 shows that the reverse recovery occurs between about 2.1 sec ($10^{-7}$) and 2.6 sec ($10^{-7}$). The graph illustrates that adding a resistor between the shield and the source significantly decreases the total reverse recovery charge compared to the total reverse recovery charge of a diode without a resistive element, or with a low impedance shield to source connection. Simulations of the reverse recovery for different shield resistor values are also shown. FIG. 6 illustrates that the shield displacement charge decreases as the shield resistor increases from 3 ohms 602 to 100 ohms 604.

Care should be taken in selecting the value of the shield resistive element. If the resistance of the shield resistor is too large, a large transient potential may appear in the shield electrode. A potential in the shield electrode causes an electric field in the dielectric layer (e.g., oxide) that isolates the shield from both the drain and the gate. If the electric field in the oxide becomes too large, the oxide layer may degrade. Thus, a minimum effective resistor value is desirable to have the least impact on other performance characteristics. Alternatively, if a suitable compromise value cannot be obtained, a diode shunt that limits the shield voltage may be used along with the resistive element. For example, in embodiments of the invention, a Zener diode shunting the shield resistor is used in parallel with the resistor. When the Zener diode reaches its selected voltage, the shield electrode is clamped by shunting the shield charge through a low impedance path back to the source electrode. This protection diode can be designed into the same location as the resistor on the device.

Other embodiments of the invention balance competing design considerations when choosing the magnitude of the resistor and the thickness of the dielectrics in the trench. For example, a low resistance connection between the shield and the source allows the drain-body and drain-shield capacitors $C_{DS}$ and $C_{Dsh}$ to act in concert, providing a large drain-source capacitance. According to Equation 2, a large sum value of $C_{DS}$ and $C_{Dsh}$ provides a relatively low ratio with the shield-gate capacitance $C_{shG}$. Since the capacitors form a voltage divider, a low capacitive ratio minimizes the voltage rise on the gate in response to a transient voltage on the drain. In contrast, a higher resistance connection between the shield and the source increases the overall capacitive ratio, resulting in a larger voltage rise on the gate, $V_{gsb}$, in response to a transient voltage on the drain. A consequence of the increased resistance provided by the resistive element connecting the shield to the source is that if $V_{gsb}$ correspondingly increases to the point that it exceeds the transistor threshold voltage, the device could potentially turn on when it is supposed to be off.

One solution to this problem is to decrease the overall magnitude of the resistive element. A low resistance can minimize the transient gate voltage $V_{gsb}$. However, decreasing the resistance also increases the shield displacement current that contributes to the diode's total reverse recovery. Thus a proper balance for a minimum effective magnitude of the resistive element must be achieved.

Another solution to the problem of the increased voltage on the gate is to reduce the overall capacitive ratio. According to Equation 2, the overall capacitive ratio can be reduced by increasing the value of the denominator, the equivalent capacitance of $C_{shG}$, $C_{Dsh}$ and $C_{DS}$, or decreasing the value of the numerator, $C_{shG}$. Since the magnitude of the capacitance is inversely proportional to the thickness of the capacitive layer, a reduction in the overall capacitive ratio can be caused by decreasing the thickness of the dielectric associated with $C_{Dsh}$ or increasing the thickness of the dielectric associated with $C_{shG}$.

Thus, reducing the thickness of the oxide that isolates the shield from the drift region reduces the capacitive ratio by increasing the shield capacitance $C_{Dsh}$ (denominator of the capacitive ratio). However, an increased shield capacitance $C_{Dsh}$ will also increase the shield displacement current, and thus counteract the benefit to the diode's recovery charge of the shield resistance connection according to an embodiment of the invention. Alternatively, increasing the IPD oxide layer between the shield and the gate reduces the capacitive ratio by decreasing the capacitance $C_{shG}$ (numerator of the capacitive ratio). While this causes the least impact to the diode reverse recovery charge, the trade-off in this case is a potential rise in the gate-drain capacitance due to the diminishing influence of the shield on the incursion of the drain electric field into the area around the gate. Thus, a careful balance of design features, oxide thickness and shield resistor values, is necessary to produce optimum performance of embodiments of the invention.

Although a number of specific embodiments are shown and described above, the invention is not limited to them. Other alternatives, modifications and equivalents that enable the shield voltage to track the drift region more closely and thus reduce dV/dt at the shield capacitor are possible.

What is claimed is:

1. A synchronous buck converter comprising:
a high-side switch and a low-side switch serially coupled to one another, wherein the low-side switch includes a field effect transistor which comprises:
a trench extending into a drift region of the field effect transistor;
a shield electrode in a lower portion of the trench, wherein the shield electrode is insulated from the drift region by a shield dielectric;
a gate electrode in the trench over the shield electrode, wherein the gate electrode is insulated from the shield electrode by an inter-electrode dielectric;
source regions adjacent the trench;
a source metal contacting the source regions; and
a resistive element having one end contacting the shield electrode and another end contacting the source metal in the field effect transistor.

2. The synchronous buck converter of claim 1 further comprising a controller block connected to gates of the high-side and low-side switches.

3. The synchronous buck converter of claim 2 wherein the controller block includes a first driver connected to a gate of the high-side switch, and a second driver connected to a gate of the low-side switch.

4. The synchronous buck converter of claim 2 wherein the high-side switch is connected between a first supply voltage and an inductor, and the low-side switch is connected between the inductor and a second supply voltage.

5. The synchronous buck converter of claim 1 wherein the resistive element induces a potential in the shield electrode during a switching event.

6. The synchronous buck converter of claim 1 further comprising an independent shield metal line which contacts the resistive element and the shield electrode.

7. The synchronous buck converter of claim 1 wherein the resistive element is coupled to the shield electrode by a shield contact and to the source metal by a source contact.

8. The synchronous buck converter of claim 1 wherein the resistive element comprises a poly-silicon layer.

9. The synchronous buck converter of claim 1 wherein the resistive element is a single resistor.

10. The synchronous buck converter of claim 1 wherein the resistive element comprises at least two resistors connected in parallel.

11. The synchronous buck converter of claim 1 wherein the resistive element is coupled to a protective diode shunt.

12. The synchronous buck converter of claim 1 wherein the resistive element is connected in parallel to a Zener diode.

13. The synchronous buck converter of claim 1 wherein the resistive element is less than 30 ohms.

14. The synchronous buck converter of claim 1 wherein the resistive element has a serpentine shape.

15. A synchronous buck converter comprising:
a high-side switch and a low-side switch serially coupled to one another, wherein the low-side switch includes a field effect transistor which comprises:
a plurality of trenches extending into a drift region;
a shield electrode in a lower portion of each trench, wherein the shield electrode is insulated from the drift region by a shield dielectric;
a gate electrode in each trench over the shield electrode, wherein the gate electrode is insulated from the shield electrode by an inter-electrode dielectric;
source regions adjacent the trenches;
a source metal contacting the source regions; and a resistive element having one end contacting the shield electrode and another end contacting the source metal.

16. The synchronous buck converter of claim 15 further comprising a controller block connected to gates of the high-side and low-side switches.

17. The synchronous buck converter of claim 16 wherein the controller block includes a first driver connected to a gate of the high-side switch, and a second driver connected to a gate of the low-side switch.

18. The synchronous buck converter of claim 16 wherein the high-side switch is connected between a first supply voltage and an inductor, and the low-side switch is connected between the inductor and a second supply voltage.

19. The synchronous buck converter of claim 15 further comprising an independent shield metal line which contacts the resistive element and the shield electrode.

20. The synchronous buck converter of claim 15 wherein the resistive element comprises a poly-silicon layer.

* * * * *